(12) United States Patent
Mann et al.

(10) Patent No.: US 7,199,922 B2
(45) Date of Patent: Apr. 3, 2007

(54) REFLECTIVE PROJECTION LENS FOR EUV-PHOTOLITHOGRAPHY

(75) Inventors: Hans-Juergen Mann, Oberkochen (DE); Wilhelm Ulrich, Aalen (DE); Russell M. Hudyma, San Ramon, CA (US)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/183,877

(22) Filed: Jul. 19, 2005

(65) Prior Publication Data
US 2005/0248835 A1 Nov. 10, 2005

Related U.S. Application Data

(62) Division of application No. 10/208,842, filed on Aug. 1, 2002, now Pat. No. 6,927,901.

(60) Provisional application No. 60/308,861, filed on Aug. 1, 2001.

(51) Int. Cl.
*G02B 17/00* (2006.01)
*G21K 5/00* (2006.01)

(52) U.S. Cl. .................. 359/366; 359/365; 359/857; 378/34

(58) Field of Classification Search ........ 359/350–366, 359/725–733, 850–861; 355/52–77; 378/34, 378/85
See application file for complete search history.

(56) References Cited

U.S. PATENT DOCUMENTS

| | | | |
|---|---|---|---|
| 4,804,258 A | 2/1989 | Kebo | 359/366 |
| 5,063,586 A | 11/1991 | Jewell et al. | 328/34 |
| 5,153,898 A | 10/1992 | Suzuki et al. | 328/34 |
| 5,222,112 A | 6/1993 | Terasawa et al. | 328/34 |
| 5,315,629 A | 5/1994 | Jewell et al. | 328/34 |
| 5,436,763 A | 7/1995 | Chen et al. | 359/565 |
| 5,825,553 A | 10/1998 | Chen | 359/643 |
| 5,911,858 A | 6/1999 | Ruffner | 204/192.27 |
| 5,973,826 A | 10/1999 | Chapman et al. | 359/355 |
| 6,033,079 A | 3/2000 | Hudyma | 359/857 |
| 6,072,852 A * | 6/2000 | Hudyma | 378/34 |
| 6,183,095 B1 * | 2/2001 | Hudyma | 359/857 |
| 6,262,836 B1 | 7/2001 | Hudyma et al. | 359/366 |
| 6,353,470 B1 * | 3/2002 | Dinger | 355/71 |
| 6,600,552 B2 | 7/2003 | Dinger | 355/67 |

OTHER PUBLICATIONS

Stearns D.G. et al., "Multilayer Mirror Technology For Soft-X-Ray Projection Lithography", Dec. 1, 1993, Applied Optics Vo. 32, No. 34, pp. 6952-6960.

* cited by examiner

*Primary Examiner*—Thong Q Nguyen
(74) *Attorney, Agent, or Firm*—Sughrue Mion, PLLC (57) ABSTRACT

A projection lens for imaging a pattern arranged in an object plane onto an image plane using electromagnetic radiation from the extreme-ultraviolet (EUV) spectral region has several imaging mirrors between its object plane and image plane that define an optical axis of the projection lens and have reflective coatings. At least one of those mirrors has a graded reflective coating that has a film-thickness gradient that is rotationally symmetric with respect to a coating axis, where that coating axis is acentrically arranged with respect to the optical axis of the projection lens. Providing at least one acentric, graded, reflective coating allows designing projection lenses that allow highly uniform field illumination, combined with high total transmittance.

6 Claims, 8 Drawing Sheets

REFLECTIVE PROJECTION LENS FOR EUV-PHOTOLITHOGRAPHY

This is a divisional of application Ser. No. 10/208,842 filed Aug. 1, 2002, now U.S. Pat. No. 6,927,901, which is hereby incorporated into the present application by reference and which claims benefit of Provisional Application No. 60/308,861 filed Aug. 1, 2001.

BACKGROUND OF THE INVENTION

1. Field of the Invention

The invention relates to a projection lens for imaging a pattern arranged in an object plane onto an image plane employing electromagnetic radiation from the extreme-ultraviolet (EUV) spectral region.

2. Description of the Related Art

Projection lenses of that type are employed on projection exposure systems used for fabricating semiconductor devices and other types of microdevices and serve to project patterns on photomasks or reticles, which shall hereinafter be referred to using the generic terms "masks" or "reticles," onto an object having a photosensitive coating at ultrahigh resolution.

In order to allow creating even finer structures, various approaches to improving the resolving power of projection lenses are being pursued. It is well known that resolving power may be improved by increasing the image-side numerical aperture (NA) of the projection lens. Another approach is employing shorter-wavelength electromagnetic radiation.

However, improving resolution by increasing numerical aperture has several disadvantages. The major disadvantage is that the attainable depth of focus (DOF) decreases with increasing numerical aperture, which is disadvantageous because, for example, a depth of focus of the order of at least one micrometer is desirable in view of the maximum-attainable planarity of the substrate to be structured and mechanical tolerances. Systems that operate at moderate numerical apertures and improve resolving power largely by employing short-wavelength electromagnetic radiation from the extreme-ultraviolet (EUV) spectral region have thus been developed. In the case of EUV-photolithography employing operating wavelengths of 13.4 nm, resolutions of the order of 0.1 µm at typical depths of focus of the order of 1 µm may theoretically be obtained for numerical apertures of NA=0.1.

It is well known that radiation from the extreme-ultraviolet spectral region cannot be focused using refractive optical elements, since radiation at the short wavelengths involved is absorbed by the known optical materials that are transparent at longer wavelengths. Mirror system that have several imaging, i.e., concave or convex, mirrors that have reflective coatings arranged between their object plane and image plane and define an optical axis of the projection lens are thus employed in EUV-photolithography. The reflective coatings employed are typically multilayer coatings having, for example, alternating layers of molybdenum and silicon.

A reflective lens for use in EUV-photolithography that has four mirrors, each of which has reflective coatings with uniformly thick layers, is disclosed in U.S. Pat. No. 5,973,826.

Another EUV-photolithographic system is shown in U.S. Pat. No. 5,153,898. That system has a maximum of five mirrors, at least one of which has an aspherical reflecting surface. Numerous combinations of materials for multilayer reflective coatings suitable for use in the EUV are stated. Their layers all have uniform thicknesses.

Although reflective coatings with uniform thicknesses are relatively simple to deposit, in the case of imaging systems where the angle of entry, or angle of incidence, of the radiation employed on those areas of the mirrors utilized varies, they usually generate high reflection losses, since the thicknesses of their layers are optimized for a specially selected angle of incidence, or a narrow range of angles of incidence, only. Another of their disadvantages is a nonuniform pupil irradiance that causes a telecentricity error, structurally dependent or field-dependent resolution limits (so-called "H-V-differences or "CD-variations"), and generally lead to a narrowing down of the processing window.

Reflective EUV-imaging systems that have mirrors that have graded reflective coatings that are characterized by the fact that they have a film-thickness gradient that is rotationally symmetric with respect to the optical axis of the entire system are also known (cf. U.S. Pat. No. 5,911,858). Employing graded reflective coatings allows achieving a more uniform distribution of the reflected intensity over a certain range of angles of incidence.

Photolithographic equipment, or steppers, employ two different methods for projecting a mask onto a substrate, namely, the "step-and-repeat" method and the "step-and-scan" method. In the case of the "step-and-repeat" method, large areas of the substrate are exposed in turn, using the entire pattern present on the reticle. The associated projection optics thus have an image field that is large enough to allow imaging the entire mask onto the substrate. The substrate is translated after each exposure and the exposure procedure repeated. In the case of the step-and-scan method that is preferred here, the pattern on the mask is scanned onto the substrate through a movable slit, where the mask and slit are synchronously translated in opposite directions at rates whose ratio equals the projection lens' magnification.

SUMMARY OF THE INVENTION

It is one object of the invention to provide an EUV-projection lens operable at high numerical aperture that will allow largely correcting distortion errors along all image directions and providing sufficiently symmetric, high-intensity, illumination of the image field, while maintaining adequate-quality imaging. It is another object to provide a projection lens that, from the optical standpoint, represents a reasonable compromise among wavefront errors, distortion, total transmittance, field uniformity, and uniform pupil irradiance.

As a solution to these and other object the invention, according to one formulation, provides a projection lens for imaging a pattern arranged in an object plane onto an image plane employing electromagnetic radiation from the extreme-ultraviolet (EUV) spectral region, wherein several imaging mirrors that have reflective coatings and define an optical axis of the projection lens are arranged between the object plane and the image plane, wherein at least one of those mirrors has an acentric, graded, reflective coating that has a film-thickness gradient that is rotationally symmetric with respect to a coating axis, wherein that coating axis is acentrically arranged with respect to the optical axis of the projection lens.

The acentricity or eccentricity of a graded, rotationally symmetric, reflective coating with respect to the optical axis of the entire system provided by the invention yields an additional degree of freedom for optimizing the optical characteristics of the projection lens that is lacking in conventional systems, where due account should be taken of the fact that the design, or optical layout, of an EUV-projection system may be roughly segregated into two, consecutive, stages. The first stage is optimizing the layout and designs of the uncoated mirror substrates using a computer and suitable optical-design software, duly allowing for the traditional criteria, such as wavefront aberrations, distortion, assembly conditions, fabrication conditions, etc. Their reflective coatings are then computed and the design recomputed, duly taking account of their reflective coatings. The coatings are effectively "stuck onto" the uncoated substrates, which generally results in imaging performance that is much worse than that of the system with uncoated optics, which, as a rule, will be intolerable unless the system is subsequently reoptimized.

Among other things, that reoptimization should take account of wavefront aberrations and wavefront apodizations caused by the reflective coatings. The competing effects involved are primarily total system transmittance and field uniformity. It has been found that these key properties are usually affected in opposite manners by the sorts of design modifications available. Good compromise solutions that provide adequate total transmittance combined with adequate field uniformity may be particularly favorably obtained using acentric, rotationally symmetric, reflective coatings, where it has generally been found that providing acentric, graded, reflective coatings is particularly beneficial to total transmittance. Field uniformity, on the other hand, is benefited by reflective coatings that are centered on the optical axis.

Angular-range computations for the individual reflective surfaces, from which, in particular, the area of each mirror that is actually utilized (their "footprints"), the average angle of incidence at every point on their surface and the angular bandwidths, or ranges of angles of incidence, at each point on their surfaces may be derived, usually serve as the starting point for this reoptimization. The particularly important items of that data are the average angles of incidence and the ranges of angles of incidence (angular bandwidths).

Since the primary purpose of the reflective coatings employed on EUV-systems is reflecting as much of incident electromagnetic radiation as possible, designs may be optimized for maximum reflectance, where the average angles of incidence at every point obtainable from angular-range computations may be called upon and used as a basis for computing the film thicknesses needed for optimizing reflectance. The manner in which this proceeds will be largely determined by the shape of the object field, which, in the case of the preferred embodiment, is an annular segment.

It has proven beneficial to provide that at least that mirror that has the largest range of angles of incidence, i.e., the largest angular bandwidth, has an acentric, graded, reflective coating. The invention is based on the recognition that employment of constant film thicknesses causes enormous reflectance losses on systems where angles of incidence vary widely over their reflective sections, since films that have constant thicknesses may be optimized for a specially selected angle of incidence, or for a narrow range of angles of incidences, only. This is particularly a problem on high-aperture systems, e.g., systems for which NA>0.2), since angles of incidence on their mirrors are largely determined by their numerical aperture. Once those mirrors that have the largest range of angles of incidence have been identified, design modifications, such as shifting a rotationally reflective coating off-axis, will allow highly effectively tailoring the system's imaging characteristics.

In the case of a preferred embodiment, the range of angles of incidence of that mirror that has the largest range of angles of incidence extends to angles less than 5° to 10° and angles exceeding 10° to 15°. The range of angles of incidence involved may, for example, range from about 1° to about 17°.

In cases where a reflective system is to be optimized for extremely high total transmittance and field uniformity is either unimportant or plays a minor role, it may be beneficial to employ at least one of those mirrors having the largest range of angles of incidence has an acentric, graded, reflective coating whose film-thickness gradient may be optimized in the radial direction such that they will have high reflectance for the radiation employed over the full range of angles of incidence involved. However, in cases where complex optimizations are involved, it may turn out that employing coatings that have been optimized for high reflectance will displace the system so far from an original local minimum that had been reached that that minimum will no longer be automatically locatable, which might result in a new design, instead of a reoptimized design.

Since employing a single, acentric, graded, reflective coating on a reflective system may, in addition to the desired beneficial effects, also adversely affect imaging performance, a preferred embodiment has a mirror that has a first, acentric, graded, reflective coating and at least one other mirror that has a second, acentric, graded, reflective coating whose acentricities, film-thickness gradients, etc., have been adapted to suit one another such that the contributions of their reflective coatings to certain imaging errors are at least partially compensated, where distortion along the cross-scan direction (the x-direction) will be particularly critical, since, for this sort of distortion, there is no compensating effect along the orthogonal y-direction due to the scanning. In the case of preferred embodiments, the acentricities of their reflective coatings are thus configured such that their coating axis is acentric with respect to the projection lens' optical axis along a y-direction, which, in the case of a scanner, corresponds to the scanning direction.

It has proven beneficial to provide that the film thicknesses, d, of their rotationally symmetric film-thickness gradients have the following form:

$$d = d_0 \sum_{i=0}^{n} c_{2i}(r - r_0)^{2i}, \qquad (1)$$

where $d_0$ is the optimal film thickness for normal incidence (0° angle of incidence), $r_0$ is the acentricity of the coating axis relative to the system's optical axis in the x-y plane, r is the current radial coordinate in the x-y plane, the parameters, c are polynomial coefficients, and n is an integer. The preferred film-thickness gradient may thus be described by a second-order polynomial lacking any odd-powered terms, in particular, lacking a linear term, that may, in the simplest case, be, for example, a parabola.

A preferred projection lens that will be described in detail in conjunction with a sample embodiment has six mirrors between its object plane and image plane. The fifth mirror following its object plane is that mirror that has the largest range of angles of incidence. In the case of a system that has been optimized for maximum reflectance, this mirror may have a centered, graded, reflective coating. In the case of other embodiments, several of their mirrors are provided with centered, graded, reflective coatings that have been adapted to suit one another such that their pupil-irradiance distributions are substantially rotationally symmetric. Preferred here are two, and no more than four, such mirrors, since lateral film-thickness gradients are difficult to deposit. At least this fifth mirror is provided with an acentric, graded, reflective coating in order to allow simultaneously optimizing several quality criteria, in particular, total transmittance and distortion. The projection lens may have an image-side numerical aperture, NA of greater than or equal to 0.15, or more specifically, greater than or equal to 0.2.

Particularly beneficial results are achieved when at least one of those mirrors that precede the fifth mirror, for example, the third or fourth mirror, also has an acentric, graded, reflective coating, where the axes of rotation of both film-thickness gradients of the cascaded, graded, reflective coatings are acentrically displaced parallel to the optical axis such that their respective contributions to distortion along the cross-scan direction at least partially compensate one another.

The foregoing and other characteristics will be apparent, both from the claims and from the description and the drawings, where the individual characteristics involved may represent characteristics that are patentable alone or in the form of combinations of subsets thereof in an embodiment of the invention and in other fields.

DETAILED DESCRIPTION OF THE PREFERRED EMBODIMENTS

In the following description of the major principles of the invention, the term "optical axis" shall refer to a straight line or a sequence of straight-line segments passing through the paraxial centers of curvature of the optical elements involved, which, in the case of embodiments described here, consist exclusively of mirrors that have curved reflecting surfaces. In the case of those examples presented here, the object involved is a mask (reticle) bearing the pattern of an integrated circuit or some other pattern, such as a grating. In the case of those examples presented here, its image is projected onto a wafer coated with a layer of photoresist that serves as a substrate, although other types of substrate, such as components of liquid-crystal displays or substrates for optical gratings, may also be involved.

Figure 1:
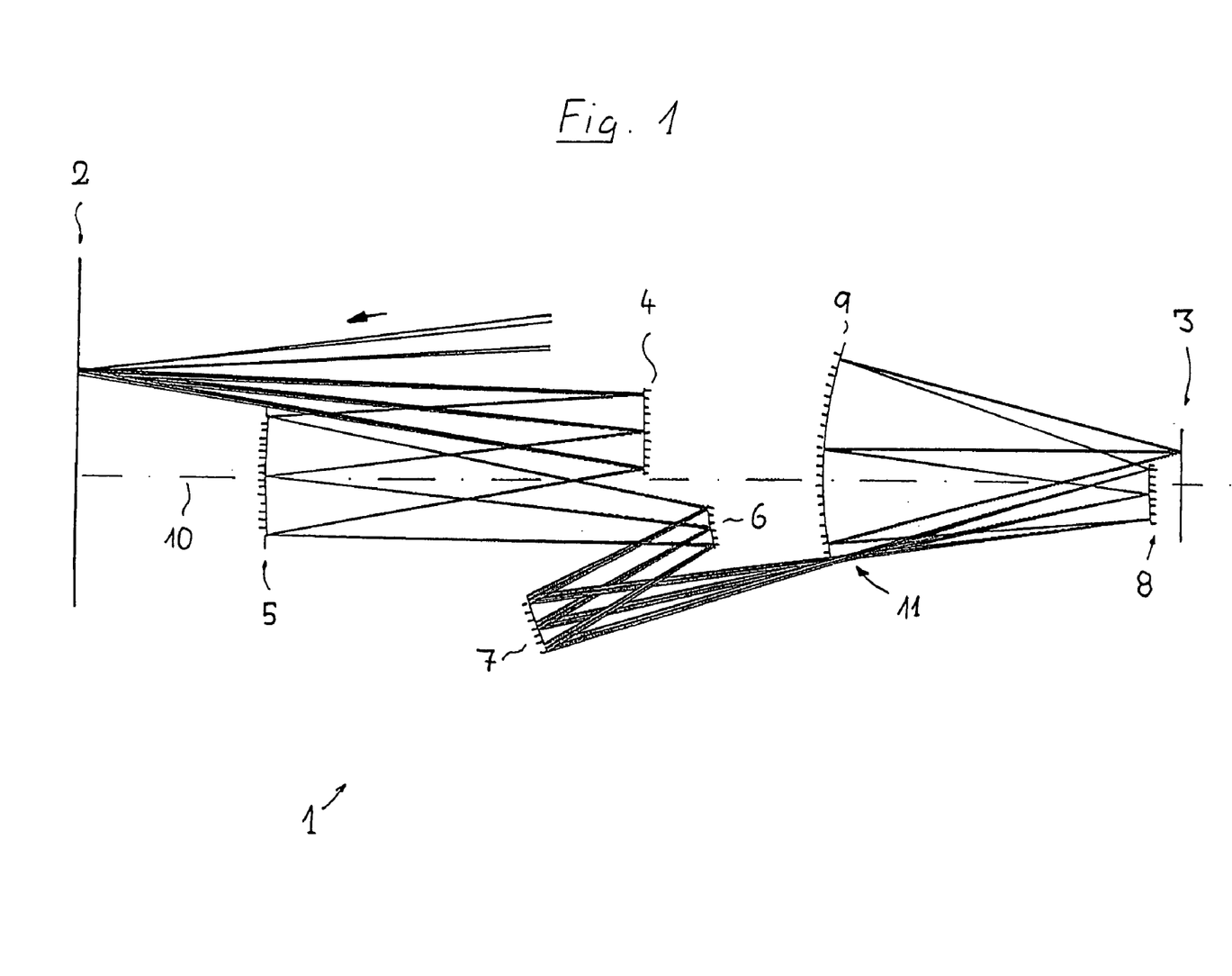
FIG. 1 is a schematized longitudinal sectional drawing of an embodiment of an EUV-projection lens that has six mirrors.

A typical layout of an EUV-projection lens 1 based on a preferred sample embodiment is shown in FIG. 1. It serves to project an image of a pattern on a reticle or similar arranged in an object plane 2 onto an image plane 3 aligned parallel to that object plane on a reduced scale, for example, a scale 4:1. Imaging is by means of electromagnetic radiation from the extreme-ultraviolet (EUV) spectral region, in particular, at an operating wavelength of about 13.4 nm. A total of six mirrors 4–9 that have curved reflecting surfaces, and are thus imaging mirrors, are mutually coaxially arranged between the object plane 2 and image plane 3 such that they define a common optical axis 10 that is orthogonal to the image plane and object plane. The substrates of those mirrors 4–9 have rotationally symmetric, aspherical, surface figures whose symmetry axes coincide with their common physical axis 10. This six-mirror system, which has been designed for operation in step-and-scan mode and operates with an off-axis annular field, achieves a numerical aperture, NA, of NA=0.25 for an annular field with typical field dimensions of 2 mm×26 mm.

As may be seen from FIG. 1, light from an illumination system (not shown) that includes a soft-X-ray light source initially strikes a reflective mask arranged in the object plane 2 from the side of the object plane 2 opposite the image. Light reflected by the mask strikes a first mirror 4 that has a concave reflecting surface facing the object that reflects it, slightly narrowed down, to a second mirror 5. This second mirror 5 has a concave reflecting surface facing the first mirror 4 that reflects the radiation toward a third mirror 6, in the form of a convergent beam. This third mirror 6 has a convex reflecting surface that reflects the off-axial incident radiation to a fourth mirror 7 that is utilized in a mirror section situated far away from the optical axis and reflects incident radiation to a fifth mirror 8 arranged in the vicinity of the image plane 3, while forming a real intermediate image 11. The latter mirror has a convex reflecting surface facing away from the image plane that reflects the incident, divergent, radiation toward a sixth mirror 9 that has a concave reflecting surface facing the image plane 3 that reflects incident radiation and focuses it on the image plane 3.

All reflecting surfaces of the mirrors 4–9 have reflectance-enhancing reflective coatings deposited on them. In the case of preferred embodiments, these coatings are stacks of, for example, about forty alternating pairs of layers, each of which includes a layer of silicon and a layer of molybdenum.

Figure 17:
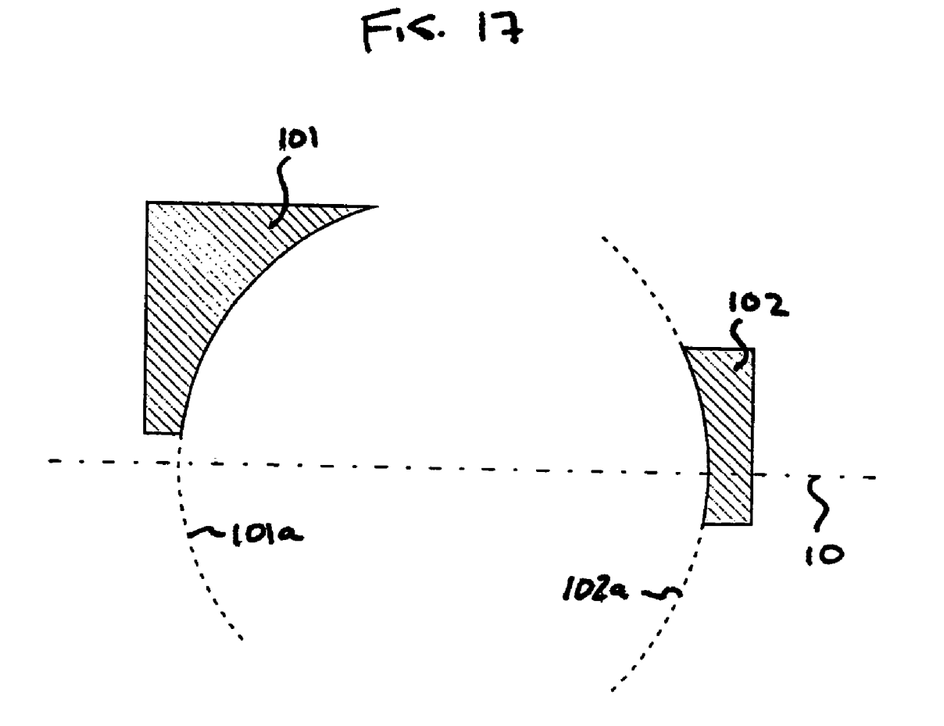
FIG. 17 illustrates exemplary mirrors 101 and 102 having curvature surfaces 101a and 102a, respectively.
Figure 18:
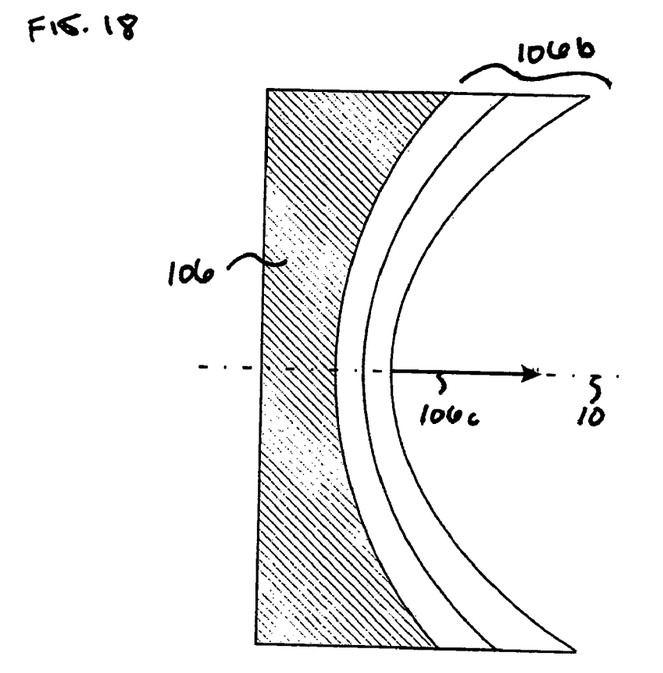
FIG. 18 illustrates exemplary mirror 106 having a coating 106b with a coating axis 106c coaxial with the axis 10.
Figure 19:
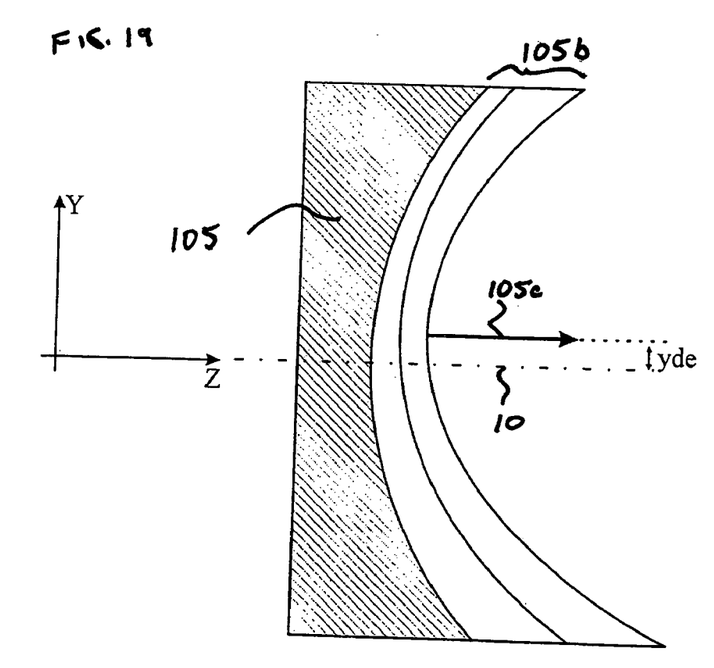
FIG. 19 illustrates exemplary mirror 105 having a coating 105b with a coating axis 105c acentric with respect to the axis 10.

As related to FIGS. 17–19, the several imaging mirrors of the EUV projection lens 1 of FIG. 1 have reflective coatings and define an optical axis of the projection lens. The relation of these several mirrors to the optical axis 10 of the projection lens is illustrated in FIG. 17, where exemplary mirrors 101 and 102 have curvature surfaces 101a and 102a with axes coaxial with optical axis 10. As shown in FIG. 1, the several mirrors are arranged between the object plane and the image plane, and at least one of those mirrors has an acentric, graded, reflective coating (such as coating 105b of mirror 105, FIG. 19) that has a film-thickness gradient that is rotationally symmetric with respect to a coating axis (such as coating axis 105c, FIG. 19), wherein that coating axis is acentrically arranged with respect to the optical axis 10 of the projection lens. As shown by exemplary mirror 105 of FIG. 19, the coating axis 105c of the coating 105b is offset from the optical axis 10 by a distance yde.

Table 1 summarizes the design shown in tabular form, where its first row lists the number of the reflective, or otherwise designated surfaces, involved, its second row lists the radius of those surfaces [mm], and third row lists the distance between the respective surface involved and the next surface [mm]. The algebraic signs of the radii have been chosen such that a positive sign corresponds to a center of curvature of the reflecting surface that lies on the image-plane side. Its fourth through ninth rows, which are designated "A" through "E," list the aspheric coefficients of the aspherical reflecting surfaces. It may be seen that all reflecting surface are spherically curved. Their aspherical surfaces may be computed using the following equation:

$$p(h)=[((1/r)h^2)/(1+SQRT(1-(1+K)(1/r)^2h^2)]+Ah^4+Bh^6+\ldots,$$

where 1/r is their curvature and h is the distance of a point on their surface from the optical axis. p(h) thus represents the radial distance of a point on their surface from the inflection point of their surface along the z-direction, i.e., along the optical axis. The constants K, A, B, etc., are listed in Table 1.

The coefficients, C0, C2, xde, and yde, listed in the rows that follow describe the film-thickness gradients for the reflective coatings that, in the case of a preferred embodiment, are applied to the respective mirrors, in accordance with the formula appearing in Eq. 1, which has been explained above, where $r_0 = \sqrt{xde^2 + yde^2}$.

The effects that the reflective coatings chosen have on the imaging performance of the projection lens will now be discussed in several stages.

Computerized design of those reflective coatings was conducted under the boundary condition that each of the coating designs employed should be allowed to distort the transmitted wavefront only to the point where the entire system would not be displaced from a local minimum of its characteristics that was found when the system's basic design was developed for the case of uncoated substrates, where higher-order wavefront errors hardly occurred at all. The major effects are distortion and defocusing. In addition to the wavefronts, described by, for example, Zernike coefficients and distortion along the scanning direction, the y-direction, and the cross-scan direction, the x-direction, the quality criteria that apply to such coating designs are field uniformity and pupil apodization. System design and fabrication characteristics remain virtually unchanged compared to the those of the basic design with uncoated substrates.

We shall start off by describing a projection lens, all of whose reflective coatings have constant film thicknesses, where it is useful to compute an average angle of incidence from the computations of ranges of angles of incidence for all mirrors, where their average angles of incidence should be computed over their entire utilized surfaces. The associated, optimal, film thicknesses are then computed, based on these global average angles of incidence, and inserted into an associated coating design in a known manner. The major effect of these uniformly thick films is a constant image offset along the scanning direction, accompanied by a readily recognizable defocusing. This first-order error may be corrected by a reoptimization. Wavefront aberrations, which are designated by their rms-values, were about 20% worse than those for designs with uncoated mirrors.

Figure 2:
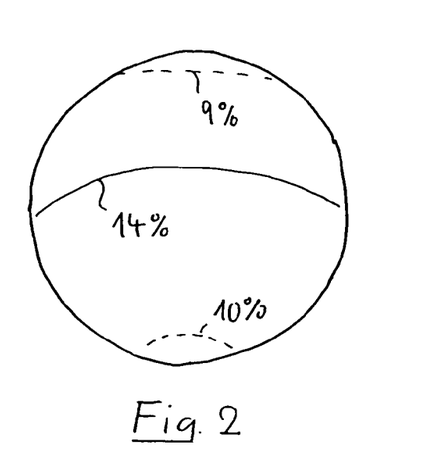
FIG. 2 is a schematized representation of a transmittance distribution at the exit pupil of that projection lens for a field point on its symmetry axis for the case where a reflective coating having a constant film thickness is employed on all of its mirrors.
Figure 3:
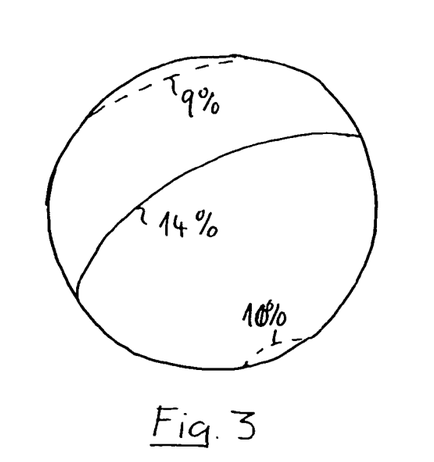
FIG. 3 is an associated transmittance distribution at its exit pupil for a field point at the edge of its annular field.

FIGS. 2 and 3 present plots of the irradiance distribution at the projection lens' circular exit pupil for two field points, where FIG. 2 plots the distribution for a field point lying on the system's symmetry axis and FIG. 3 plots the distribution for a field point at the edge of its annular field. The percentages stated designate fractions of the irradiance at the entrance of the projection lens. In keeping with the rotational symmetry of the system and the coatings employed, which are rotationally symmetric with respect to any axis parallel to the optical axis due to their constant film thicknesses, these two irradiance distributions differ only in a rotation about the exit pupil's axis. The rotation angle involved results from the location of the field point in the object plane or image plane.

Figure 4:
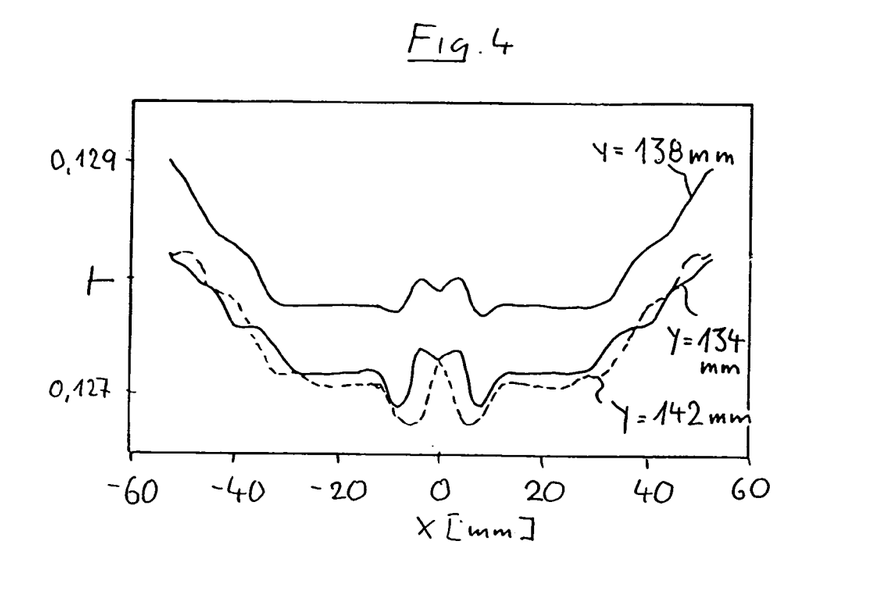
FIG. 4 is a plot of the transmittance distribution over its image field for the case where reflective coatings having constant film thicknesses are employed.

These schematic representations show that a pronounced pupil apodization occurs. The irradiance level varies from about 3% to 14% over the pupil. Those areas having differing pupil irradiances are indicated by contours of constant intensity in FIGS. 2 and 3. The special form of these distributions, whose center lies outside the exit pupil, would cause large differences (h-v-differences) between the critical dimensions (CD-values) for horizontal and vertical features. FIG. 4 schematically depicts the transmittance distribution over the field. Although the variations along the scanning direction, which correspond to the plot's y-axis, have no significant adverse effects due to the integrating effect of scanning, the nonuniformities normal to the scanning direction, i.e., the cross-scan direction, or x-direction, are responsible for CD-variations over the field. However, weighting the irradiation distribution with the irradiance distribution at the reticle will allow achieving a dynamic uniformity of around 1%, which may be adequate for many types of applications. In the case of the example shown, the average transmittance is about 13%, which represents a very high value, in view of simple reflective coatings employed.

In the case of the design shown in FIG. 1, the fifth mirror 8 near the image is the mirror that has the largest variation of average angle of incidence over its utilized reflective surface, where "angle of incidence" is defined as the angle between the direction at which incident radiation is incident and the normal to its reflecting surface at the location where radiation strikes that surface. The angles of incidence involved range from about 1° to 17°. Coating this mirror with coatings that have a constant thickness will cause relatively high reflection losses.

A beneficial compromise between high reflectance and acceptable wavefront corrections may be achieved by providing that at least this mirror 8 has a rotationally symmetric, graded, reflective coating whose film-thickness gradient may be described by Eq. 1.

It has been found that in order to significantly improve reflectance it may be sufficient to adapt the film-thickness gradient along the symmetry axis to suit the average angle of incidence involved.

Figure 5:
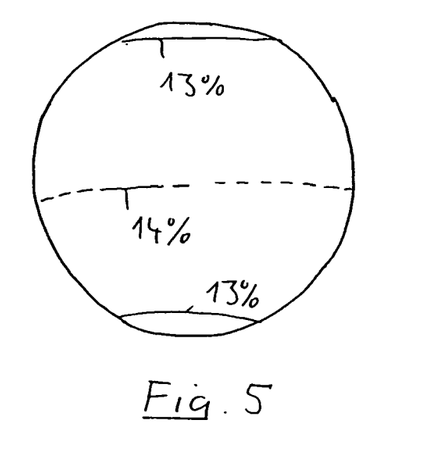
FIG. 5 is a schematized representation of a transmittance distribution at the exit pupil of a projection lens for a field point on its symmetry axis, for the case where one of its mirrors has an acentric, graded, reflective coating.
Figure 6:
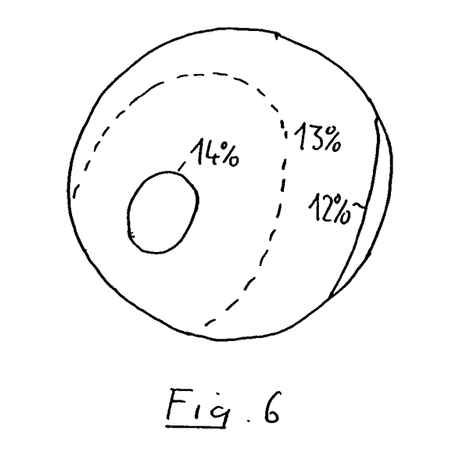
FIG. 6 is an associated transmittance distribution at its exit pupil for a field point at the edge of its annular field.
Figure 7:
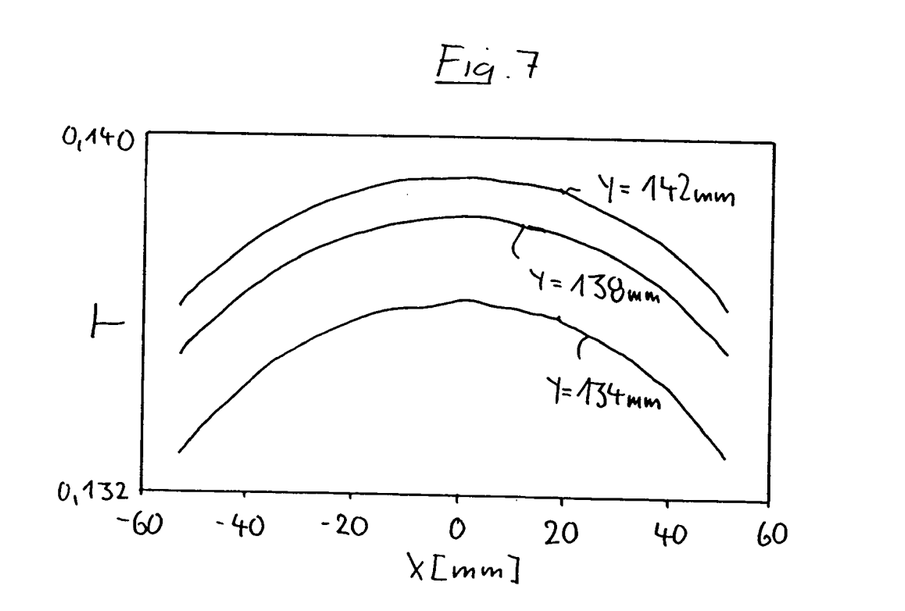
FIG. 7 is a plot of the transmittance distribution over its image field for the case where an acentric, graded, reflective coating is employed.

This will usually be a linear gradient and may be well-adapted using the polynomial of Eq. 1, provided that a corresponding acentricity ($r_0 \neq 0$) may be tolerated. FIGS. 5 and 6 present plots of intensity distributions at the exit pupil that yield a high average transmittance of, for example, 13.7%, with a variance of from about 12% to about 14%, which is thus much less than for the multilayer coatings with constant film thicknesses described above. However, the field uniformity shown in FIG. 7, which has a variance of about 2.5%, is somewhat worse than for the case of coatings with constant film thickness. However, multilayer coatings of this type, which have lateral film-thickness gradients, are suitable for use in exceptional cases only due to their relatively high distortion along the cross-scan direction (the x-direction), since scanning generates no effects that will compensate for this distortion.

Figure 8:
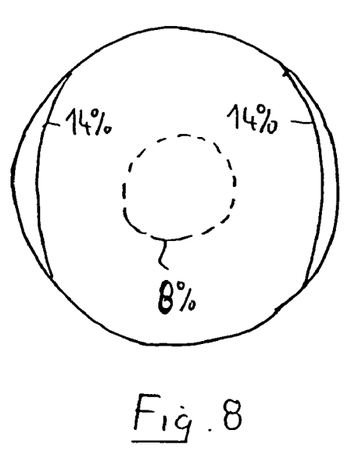
FIG. 8 is a schematized representation of the transmittance distribution at the exit pupil of a projection lens for a field point on it symmetry axis for the case where one of its mirrors has a centered, graded, reflective coating.
Figure 9:
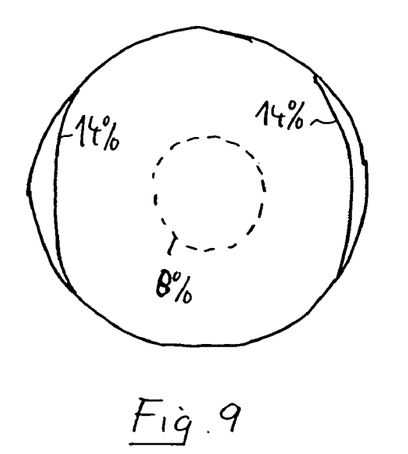
FIG. 9 is an associated transmittance distribution at its exit pupil for a field point at the edge of its annular field.
Figure 10:
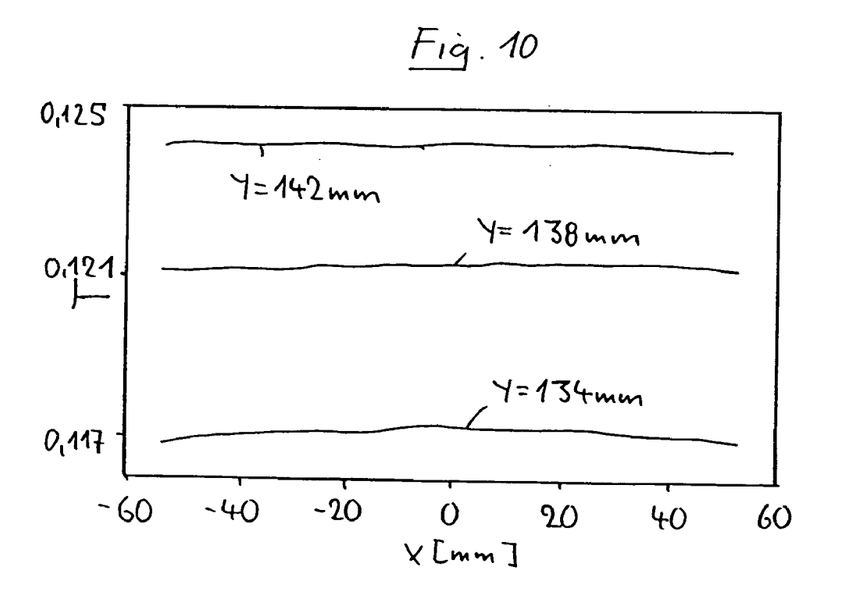
FIG. 10 is a plot of the transmittance distribution over the image field of a projection lens for the case where one of its mirrors has a centered, graded, reflective coating.

We have been able to show that this distortion along the cross-scan direction is largely attributable to the acentricity of the graded reflective coating on the fifth mirror 8. This effect can thus be reduced by keeping the acentricity involved small or arranging the graded reflective coating such that it is rotationally symmetric with respect to the optical axis. Typical optical characteristics of a design that employs a centered, graded, reflective coating on the fifth mirror are shown in FIGS. 8 through 10. It may be seen that pupil apodization, which is about 8% in the vicinity of the pupil's axis and about 14% at the edge of the pupil, is relatively large. However, it is rotationally symmetric with respect to the pupil's axis and therefore also independent of field point, which then also immediately yields the near-perfect uniformity (<0.4%) over the entire field shown in FIG. 10. The total transmittance, 12%, is less than that for the design under consideration.

Figure 11:
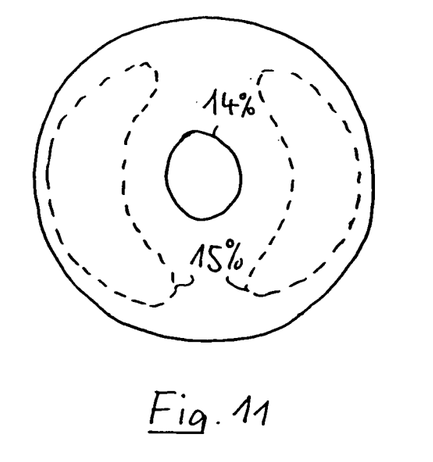
FIG. 11 is a schematized representation of the transmittance distribution at the exit pupil of a projection lens for a field point on it symmetry axis for the case where two of its mirrors have centered, graded, reflective coatings that have been adapted to suit one another in order to yield a substantially rotationally symmetric pupil-irradiance distribution.
Figure 12:
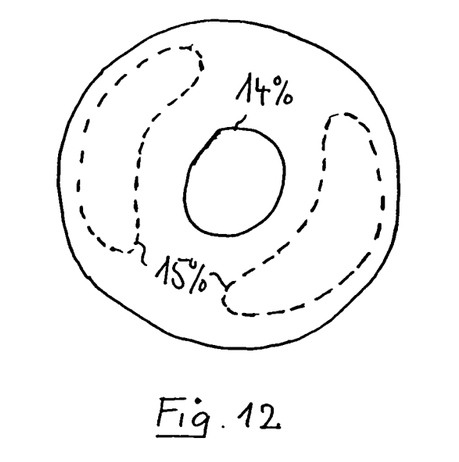
FIG. 12 is an associated transmittance distribution at its exit pupil for a field point at the edge of its annular field.
Figure 13:
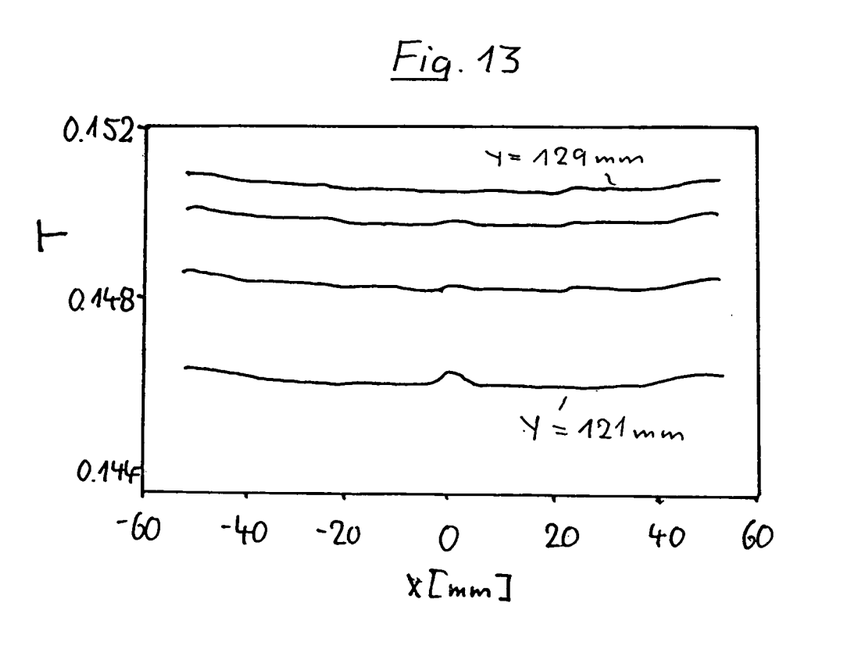
FIG. 13 is a schematized representation of the transmittance distribution at the exit pupil of a projection lens for a field point on it symmetry axis for the case where two of its mirrors have centered, graded, reflective coatings.

Another embodiment that has been optimized to yield a rotationally symmetric pupil apodization will now be described, based on FIGS. 11 through 13. In the case of this embodiment, centered, graded, reflective coatings have been applied to two mirrors, namely, to the fifth mirror 8, which has the largest range of angles of incidence, and to the sixth mirror 9 that is arranged ahead of it in the optical path. The centered film-thickness gradients of these mirrors are adapted to suit one another such that the pupil apodization is largely rotationally symmetric, as in the case of the embodiment shown in FIGS. 8 through 10. However, unlike that embodiment, in this case, the pupil apodization exhibits smaller absolute variances over the exit pupil, which significantly improves the uniformity of the illumination compared to the case where a single, centered, graded, reflective coating is employed. As may be seen from FIGS. 11 through 13, the irradiance variances at the exit pupil, which only range from about 13.4% to about 15.6%, are much less than the corresponding variances for an embodiment that employs just a single, centered, graded, reflective coating (cf. FIGS. 8 through 10). Furthermore, its total transmittance, which is about 14.7%, is much better than the latter embodiment and its field uniformity, which is less than 0.4%, is nearly perfect (cf. FIG. 13). Its rotationally symmetric exit pupil is achieved by tailoring the film-thickness gradients of the coatings on its third and fifth mirrors. This example shows that employing several, centered, graded, reflective coatings whose film-thickness gradients have been suitably adapted to suit one another will allow achieving substantially rotationally symmetric pupil-irradiance distributions.

Figure 14:
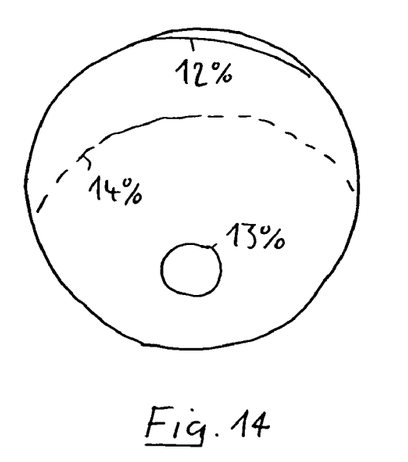
FIG. 14 is a schematized representation of the transmittance distribution at the exit pupil of a projection lens for a field point on it symmetry axis for the case where two of its mirrors have acentric, graded, reflective coatings, where the acentricities of their reflective coatings have been adapted to suit one another in order to counteract their respective contributions to distortion.
Figure 15:
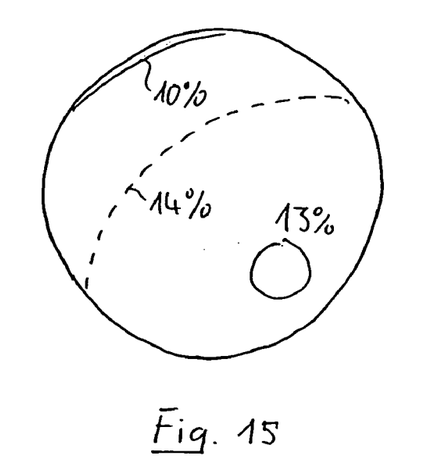
FIG. 15 is an associated transmittance distribution at its exit pupil for a field point at the edge of its annular field.
Figure 16:
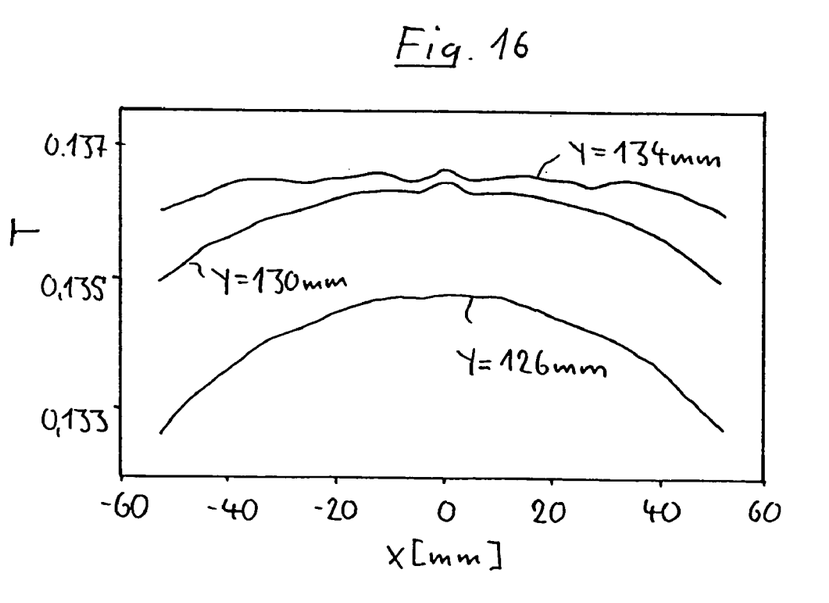
FIG. 16 is a plot of the transmittance distribution over the image field of a projection lens for the case where two of its mirrors have acentric, graded, reflective coatings for counteracting their respective contributions to distortion.

An embodiment that allows a compromise between total transmittance and field uniformity will now be described, based on FIGS. 14 through 16. In order to correct for the distortion along the cross-scan direction caused by employment of acentric multilayer coatings mentioned above, it is preferentially foreseen that that the film-thickenss gradients of the coatings on several, i.e., at last two, mirrors will be acenric and their respective acentricities will have been adapted to suit one another such that they partially, or fully, compensate for their contributions to distortion. FIGS. 14 through 16 present the characteristics of a design wherein, in addition to the fifth mirror 8 and sixth mirror 9, the third mirror 6, also has an acentric, graded, reflective coating. In addition to correcting for distortion along the cross-scan direction (residual distortions are typically less than 1 nm) and acceptable wavefront corrections (typical rms variances of less than 30 mλ), the system has a very high total transmittance of about 13.6% and an acceptable static field uniformity, which is plotted in FIG. 16, of about 1.6%. The field uniformity, as integrated by scanning motions, should be even less, around 1% or less, and thus much better. It may be seen from FIGS. 14 and 15 that these coatings generate a gradient in the irradiance distribution at the pupil that is somewhat worse than for the case where centered, graded, reflective coatings are employed (cf. FIGS. 8 and 9). The variances involved range from about 9% to 14%. However, the apodization is neither complete nor rotationally symmetric, which may adversely affect telecentricity and the processing window.

To specialists in the field, it will be clear from the explanation of the fundamental principles of the invention that, in the case of projection lenses designed for use in EUV-microlithography, employing suitably applied and, if necessary, combined, acentric, graded, reflective coatings will allow good compromises between total transmittance and field uniformity. Particularly beneficial therefor are designs that employ several, acentric, graded, reflective coatings, since employment of suitable relative arrangements of such coatings allows compensating for their adverse effects on imaging errors, such as distortion, while largely retaining their good total transmittance. If necessary, any intolerable residual errors may still be eliminated by employing additional, acentric, graded, reflective coatings. For example, an acentric grading may be applied to the first mirror in order to minimize the acentricity at the pupil recognizable in FIGS. 14 and 15, without significantly reducing total transmittance The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

TABLE 1

| Surface No. | Object | M1 | M2 | M3 | M4 | M5 | M6 | Image |
|---|---|---|---|---|---|---|---|---|
| Radius | | −10704.6665 | 1058.26338 | 355.429333 | 565.293287 | 549.218427 | 535.96002 | |
| Distance | 763.156811 | −508.895688 | 592.994217 | −263.021453 | 857.514737 | −437.185791 | 481.268511 | |
| K | | 0.129826 | −0.000242 | 0.000328 | 0.799355 | 0.000227 | 0.000006 | |
| A | | 5.01967E−10 | −8.68517E−11 | −8.94789E−10 | −6.05680E−10 | 5.28599E−09 | 6.69253E−11 | |
| B | | −3.60955E−15 | −8.37923E−16 | 1.08954E−14 | −1.14820E−15 | 1.32773E−13 | 3.07601E−16 | |
| C | | 4.75929E−20 | −7.38993E−21 | −1.55248E−18 | −3.64576E−20 | −2.91744E−18 | 1.31588E−21 | |
| D | | −1.15371E−24 | −2.26675E−25 | 1.19824E−22 | 2.50168E−25 | 6.32401E−22 | 1.28668E−27 | |
| E | | 2.35510E−29 | −8.68225E−30 | −3.89134E−27 | −1.67219E−30 | −6.82763E−26 | 7.45365E−32 | |
| C0 | | 1.005E+00 | 1.007E+00 | 1.577E+00 | 1.010E+00 | 1.035E+00 | 1.002E+00 | |
| C2 | | 0.000E+00 | 0.000E+00 | −5.062E−08 | 0.000E+00 | −6.996E−06 | 0.000E+00 | |
| xde | | 0 | 0 | 0 | 0 | 0 | 0 | |
| yde | | 0 | 0 | 3159.89 | 0 | 14.5538 | 0 | |

What is claimed is:

1. A projection lens for imaging a pattern arranged in an object plane onto an image plane employing electromagnetic radiation from the extreme-ultraviolet (EUV) spectral region,
   the projection lens comprising a plurality of imaging mirrors having reflective coatings and defining an optical axis of the projection lens,
   wherein the mirrors are arranged between the object plane and the image plane and are aligned for projection of an off-axis field from the object plane to the image plane,
   wherein the mirrors are configured and arranged with respect to one another such that every mirror is irradiated over a range of angles of incidence that is characteristic of that particular mirror,
   wherein at least one of the mirrors, having the largest range of angles of incidence, has a centric, graded, reflective coating that has a film-thickness gradient that is rotationally symmetric with respect to a coating axis, and
   wherein the coating axis is substantially coincident with the optical axis of the projection lens.

2. A projection lens according to claim 1, wherein the film-thickness gradient of the graded, reflective coating is optimized to yield a pupil-irradiance distribution that is substantially rotationally symmetric.

3. A projection lens according to claim 1, wherein at least two of the mirrors have centric, graded, reflective coatings, wherein the gradients in the film thicknesses of the reflective coatings of the at least two of the mirrors are adapted to suit one another such that the coatings yield a pupil-irradiance distribution that is substantially rotationally symmetric.

4. A projection lens according to claim 1, wherein the projection lens has an image-side numerical aperture, NA, given by NA≧0.15.

5. A projection lens according to claim 1, wherein the projection lens has an image-side numerical aperture, NA, given by NA≧0.2.

6. A method for fabricating microdevices, comprising the following steps:
   providing a mask having a prescribed pattern;
   illuminating the mask with electromagnetic radiation from the extreme-ultraviolet (EUV) spectral region; and
   projecting via a projection lens an image of the pattern onto a photosensitive substrate arranged in an image plane of the projection lens,
   wherein the projection lens comprises a plurality of imaging mirrors having reflective coatings and defining an optical axis of the projection lens,
   wherein the mirrors are arranged between the object plane and the image plane and are aligned for projection of an off-axis field from the object plane to the image plane,
   wherein the mirrors are configured and arranged with respect to one another such that every mirror is irradiated over a range of angles of incidence that is characteristic of that particular mirror,
   wherein at least one of the mirrors, having the largest range of angles of incidence, has a centric, graded, reflective coating that has a film-thickness gradient that is rotationally symmetric with respect to a coating axis, and
   wherein the coating axis is substantially coincident with the optical axis of the projection lens.

* * * * *